(12) United States Patent
Nishihagi

(10) Patent No.: US 10,877,119 B2
(45) Date of Patent: Dec. 29, 2020

(54) NMR MEASUREMENT APPARATUS AND MAGNETIC FIELD MAP CALCULATION METHOD

(71) Applicant: JEOL Ltd., Tokyo (JP)

(72) Inventor: Naoki Nishihagi, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 15/995,506

(22) Filed: Jun. 1, 2018

(65) Prior Publication Data

US 2018/0348320 A1 Dec. 6, 2018

(30) Foreign Application Priority Data

Jun. 2, 2017 (JP) ................................. 2017-109776

(51) Int. Cl.
| | | |
|---|---|---|
| *G01R 33/3875* | (2006.01) | |
| *G01R 33/44* | (2006.01) | |
| *G01R 33/46* | (2006.01) | |
| *G01R 33/24* | (2006.01) | |
| *G01R 33/56* | (2006.01) | |
| *G01R 33/00* | (2006.01) | |
| *G01R 33/561* | (2006.01) | |

(52) U.S. Cl.
CPC ..... *G01R 33/3875* (2013.01); *G01R 33/0017* (2013.01); *G01R 33/243* (2013.01); *G01R 33/443* (2013.01); *G01R 33/4625* (2013.01); *G01R 33/5608* (2013.01); *G01R 33/5615* (2013.01)

(58) Field of Classification Search
CPC ............ G01R 33/3875; G01R 33/5615; G01R 33/443; G01R 33/0017; G01R 33/243; G01R 33/4625; G01R 33/5608
See application file for complete search history.

(56) References Cited

U.S. PATENT DOCUMENTS

| | | | | |
|---|---|---|---|---|
| 2010/0127702 A1* | 5/2010 | Greiser | .............. | G01R 33/3875 324/309 |
| 2012/0105062 A1* | 5/2012 | Nishihagi | .......... | G01R 33/3875 324/318 |
| 2013/0030749 A1* | 1/2013 | Nishiyama | ........... | G01R 33/243 702/104 |

OTHER PUBLICATIONS

Marques et al., "Evaluation of a new method to correct the effects of motion-induced B0-field variation during fMRI", Proceedings of the International Society for Magnetic Resonance in Medicine, 2005, pp. 510, vol. 13.
Lamberton et al., "A New EPI-Based Dynamic Field Mapping Method: Application to Retrospective Geometrical Distortion Corrections", Journal of Magnetic Resonance Imaging, 2007, pp. 747-755, vol. 26.

(Continued)

*Primary Examiner* — Patrick Assouad
*Assistant Examiner* — Haidong Zhang
(74) *Attorney, Agent, or Firm* — The Webb Law Firm

(57) ABSTRACT

An offset map is determined in advance by a preliminary measurement process. A phase map is generated by execution of a long τ pulse sequence. A magnetic field map is calculated based on a phase map and a phase offset map. A shim adjustment is performed based on the magnetic field map. The offset map is calculated based on a first phase map acquired by execution of a first pulse sequence, a second phase map acquired by execution of a second pulse sequence, and a ratio α related to phase evolution periods.

9 Claims, 11 Drawing Sheets

(56) References Cited

OTHER PUBLICATIONS

Zahneisen et al., "Quantification and Correction of Respiration Induced Dynamic Field Map Changes in fMRI Using 3D Single Shot Techniques", Magnetic Resonance in Medicine, 2014, pp. 1093-1102, vol. 71.
Dymerska et al., "A method for the dynamic correction of B0-related distortions in single-echo EPI at 7 T", NeuroImage, 2018, pp. 321-331, vol. 168.
Alhamud et al., "Real-Time Shim Correction during Functional MRI Using a Volumetric Navigator", Proceedings of the International Society for Magnetic Resonance in Medicine, 2015, pp. 356, vol. 23.
Qingjia et al., "A new gradient shimming method based on undistorted field map of Bo inhomogeneity", Journal of Magnetic Resonance, 2016, pp. 25-32, vol. 265.
Klassen et al., "Robust Automated Shimming Technique Using Arbitrary Mapping Acquisition Parameters (RASTAMAP)", Magnetic Resonance in Medicine, 2004, pp. 881-887, vol. 51.
Extended European Search Report dated Dec. 4, 2018 in EP Application No. 18175145.4.
Barjat et al., "A Practical Method for Automated Shimming with Normal Spectrometer Hardware", Journal of Magnetic Resonance, 1997, vol. 125:1, pp. 197-201.
Liu et al., "Fast 3D gradient shimming by only 2×2 pixels in XY plane for NMR-solution samples", Journal of Magnetic Resonance, 2014, vol. 248, pp. 13-18.

\* cited by examiner

NMR MEASUREMENT APPARATUS AND MAGNETIC FIELD MAP CALCULATION METHOD

CROSS-REFERENCE TO RELATED APPLICATION

This application claims priority to Japanese Patent Application No. 2017-109776 filed Jun. 2, 2017, the disclosure of which is hereby incorporated in its entirety by reference.

BACKGROUND OF THE INVENTION

Field of the Invention

The present disclosure relates to a nuclear magnetic resonance (NMR) measurement apparatus, and in particular to correction of a static magnetic field.

Description of Related Art

An NMR measurement apparatus generally comprises a shim system. The shim system is a system for shimming, which is a process for improving spatial homogeneity of a static magnetic field by adding a correction magnetic field to the static magnetic field. A method of executing shimming using a gradient magnetic field is called gradient shimming.

Normally, the shim system comprises a shim coil unit having a group of shim coils, a driver which supplies a group of currents to the group of shim coils, a shim system controller which controls the group of currents to be applied to the group of shim coils, and the like. Using the shim system, an optimum combination of a plurality of shim values defining the correction magnetic field is searched, in a manner to cancel a spatial distribution (magnetic field map) of an inhomogeneous magnetic field component. Here, the plurality of shim values are a plurality of coefficient values to be given to a plurality of basic maps (calibration map, shim function) forming entities of a plurality of shim terms (Z1, Z2, Z3, . . . ). More specifically, after a combined map including a plurality of basic maps is added to the magnetic field map, the plurality of shim values to be given to the plurality of basic maps are adjusted, so that a difference map corresponding to the difference of the maps is set closer to zero as a whole. Based on the searched combination of the plurality of shim values, a plurality of current values are determined. In addition to one-dimensional shimming in which the shimming is executed only in a direction parallel to the static magnetic field (z direction), there also are known two-dimensional shimming and three-dimensional shimming.

A spin echo method which is one type of a magnetic field map generation method will now be described by exemplifying one-dimensional shimming.

In a spin echo method, a first pulse sequence and a second pulse sequence are employed. For example, the first pulse sequence is a pulse sequence having a short phase evolution period or time (hereinafter, "short $\tau$"), and the second pulse sequence is a pulse sequence having a long phase evolution period (hereinafter, "long $\tau$"). In both pulse sequences, a gradient magnetic field in which an intensity changes in the z direction is used in order to specify a position in the z direction. Specifics of the pulse sequences will be described later.

A short $\tau$ phase map is generated based on a complex signal acquired by frequency-analyzing a reception signal acquired as a result of execution of the first pulse sequence. Similarly, a long $\tau$ phase map is generated based on a complex signal acquired by frequency-analyzing a reception signal acquired as a result of execution of the second pulse sequence. Breakdowns of the phase maps are as follows.

Short $\tau$ phase map

=short $\tau$*$\Delta B$0inhomo magnetic field map+phase offset map (1)

Long $\tau$ phase map

=long $\tau$*$\Delta B$0inhomo magnetic field map+phase offset map (2)

Each of the above-described Equations (1) and (2) shows the breakdowns of the phase at each position in the z direction. The $\Delta B$0inhomo magnetic field map shows an inhomogeneous magnetic field component (distortion component) at each position in the z direction. Under a circumstance where such a static magnetic field inhomogeneity is generated, over the phase evolution period $\tau$, the phase is widened depending on a size of the inhomogeneous magnetic field component (a deviation (phase difference) from an on-resonance on a rotational coordinate system where transverse magnetization rotates is increased). The phase offset map is formed from phase offsets at various positions in the z direction, and may be considered to be an initial value of the phase at each position in the z direction. Such a phase offset is inevitably caused due to signal processing in the NMR measurement apparatus, and is an unknown component which does not depend on the inhomogeneous magnetic field component and which does not depend on $\tau$.

A $\Delta\tau$ phase map described below is determined by subtracting the short $\tau$ phase map from the long $\tau$ phase map.

$\Delta\tau$ phase map

=long $\tau$ phase map−short $\tau$ phase map

=(long $\tau$*$\Delta B$0inhomo magnetic field map+phase offset map)−(short $\tau$*$\Delta B$0inhomo magnetic field map+phase offset map)

=(long $\tau$−short $\tau$)*$\Delta B$0inhomo magnetic field map (3)

The above-described $\Delta\tau$ phase map shows a phase which is widened at a phase evolution period difference $\Delta\tau$ at each position in the z direction. Here, $\Delta\tau$ is equal to (long $\tau$−short $\tau$). The $\Delta B$0inhomo magnetic field map (a magnetic field map formed from inhomogeneous magnetic field components at various positions in the z direction) is determined by dividing the $\Delta\tau$ phase map calculated by Equation (3) by $\Delta\tau$. In the actual apparatus, the division by $\Delta\tau$ may be omitted under certain conditions. This is because the $\Delta\tau$ phase map may be handled as corresponding to the $\Delta B$0inhomo magnetic field map. In the process of difference calculation described above, the phase offset maps included in the above-described Equations (1) and (2) are cancelled out. As described above, based on the magnetic field map determined as described above, an optimum combination of a plurality of shim values is searched.

As a method of generating the magnetic field map, in addition to the above-described spin echo method, there also is known a gradient echo method. In both methods, the gradient magnetic field sloped in the z direction is used. In addition, in both methods, two phase evolution periods ($\tau$) are used. Alternatively, $\tau$ may be expressed as tau, TE, or the like.

Herve Barjat, Paul B Chilvers, Bayard K Fetler, Timothy J Horne, Gareth A Morris, A Practical Method for Automated Shimming with Normal Spectrometer Hardware, Journal of Magnetic Resonance, Volume 125, Issue 1, 1997, pp. 197-201 shows in FIG. 1 the spin echo method. This document shows in FIG. 2 a plurality of basic maps forming the entities of the plurality of shim terms (Z1, Z2, Z3, . . . ). Guangcao Liu, Xiaobo Qu, Shuhui Cai, Zhiyong Zhang, Zhiwei Chen, Congbo Cai, Zhong Chen, Fast 3D gradient shimming by only 2×2 pixels in XY plane for NMR-solution samples, Journal of Magnetic Resonance, Volume 248, November 2014, pp. 13-18 describes three-dimensional shimming.

In the above-described method of the related art, in acquisition of the magnetic field map, it is necessary to execute two measurements with different phase evolution periods. In addition, such a measurement of two times is repeated as necessary. Because of this, there is a problem in that a long time is required for generating the magnetic field map.

SUMMARY OF THE INVENTION

An advantage of the present disclosure lies in reduction of the number of measurements for generation of the magnetic field map representing a distribution of the inhomogeneous magnetic field component, and consequent shortening of the measurement time as a whole. Another advantage of the present disclosure lies in allowing estimation of the phase offset map itself.

According to one aspect of the present disclosure, there is provided a nuclear magnetic resonance measurement apparatus comprising: a phase offset map calculator that calculates a phase offset map which does not depend on a spatial distribution of an inhomogeneous magnetic field component or a phase evolution period, based on a first phase map acquired by preliminary execution of a first pulse sequence having a first phase evolution period and a second phase map acquired by preliminary execution of a second pulse sequence having a second phase evolution period; a magnetic field map calculator that calculates a magnetic field map which shows the spatial distribution of the inhomogeneous magnetic field component, based on a phase map acquired by execution of the second pulse sequence and the phase offset map; and an adjuster that executes shim adjustment based on the magnetic field map.

According to the structure described above, the phase offset map is calculated in advance, and then, the magnetic field map is calculated based on the actually measured phase map and the phase offset map. With such a process, it becomes possible to reduce the number of measurements in the magnetic field map calculation as compared to the related art. The above-described method can be applied in the spin echo method, the gradient echo method, and other methods. Further, the above-described method may be applied in one-dimensional shimming, two-dimensional shimming, and three-dimensional shimming.

According to another aspect of the present disclosure, the second phase evolution period is longer than the first phase evolution period. According to this structure, because the phase map is acquired by executing the second pulse sequence having a longer phase evolution period, a measurement precision of the phase map can be improved, and, consequently, a calculation precision of the magnetic field can be improved.

According to another aspect of the present disclosure, the phase offset map calculator calculates the phase offset map by calculating (the second phase map−α(the second phase map−the first phase map)), wherein α is a ratio. The above-described calculation is for cancelling the magnetic field map and specifying the phase offset map. In this process, a ratio $\alpha$ is used. According to another aspect of the present disclosure, the ratio $\alpha$ corresponds to the second phase evolution period/(the second phase evolution period−the first phase evolution period). It is desirable to actually measure the ratio $\alpha$, but alternatively, the ratio $\alpha$ may be determined from setting values of the first and second phase evolution periods.

According to another aspect of the present disclosure, the phase offset map calculator comprises: an acquirer that acquires a positive-side first phase map and a positive-side second phase map by preliminarily executing the first pulse sequence and the second pulse sequence in a state where a value of a particular shim coefficient is changed in a positive side, and that acquires a negative-side first phase map and a negative-side second phase map by preliminarily executing the first pulse sequence and the second pulse sequence in a state where the value of the particular shim coefficient is changed in a negative side; and a ratio calculator that calculates the ratio $\alpha$ based on the positive-side first phase map, the positive-side second phase map, the negative-side first phase map, and the negative-side second phase map.

According to another aspect of the present disclosure, the ratio calculator comprises: a generator that generates a first calibration map by subtracting, from a first subtraction map generated by subtracting the positive-side first phase map from the positive-side second phase map, a second subtraction map generated by subtracting the negative-side first phase map from the negative-side second phase map; a generator that generates a second calibration map by subtracting the negative-side second phase map from the positive-side second phase map; and a calculator that calculates the ratio $\alpha$ based on the first calibration map and the second calibration map.

According to another aspect of the present disclosure, the nuclear magnetic resonance measurement apparatus further comprises a ratio calculator that calculates the ratio $\alpha$ based on the first phase evolution period and the second phase evolution period. The calculator theoretically calculates the ratio from two setting values. The above-described structure includes a form in which the ratio is determined from the second phase evolution period and the phase evolution period difference.

According to another aspect of the present disclosure, there is provided a method of calculating a magnetic field map, comprising: calculating a phase offset map which does not depend on a spatial distribution of an inhomogeneous magnetic field component or a phase evolution period, based on a first phase map acquired by preliminary execution of a first pulse sequence having a first phase evolution period and a second phase map acquired by preliminary execution of a second pulse sequence having a second phase evolution period which is longer than the first phase evolution period; and calculating a magnetic field map which shows the spatial distribution of the inhomogeneous magnetic field component, based on a phase map acquired by execution of the second pulse sequence and the phase offset map.

The above-described structure estimates in advance the phase offset map which is unknown until now, and uses the phase offset map for calculation of the magnetic field map. The above-described magnetic field map calculation method is realized as a function of hardware or a function of software, and, in the case of the latter, a magnetic field map calculation program may be installed in a nuclear magnetic resonance measurement apparatus or an information processing device through a network or through a transportable recording medium.

BRIEF DESCRIPTION OF THE DRAWINGS

Embodiment(s) of the present disclosure will be described by reference to the following figures, wherein.

DESCRIPTION OF THE INVENTION

An embodiment of the present disclosure will now be described with reference to the drawings.

Figure 1:
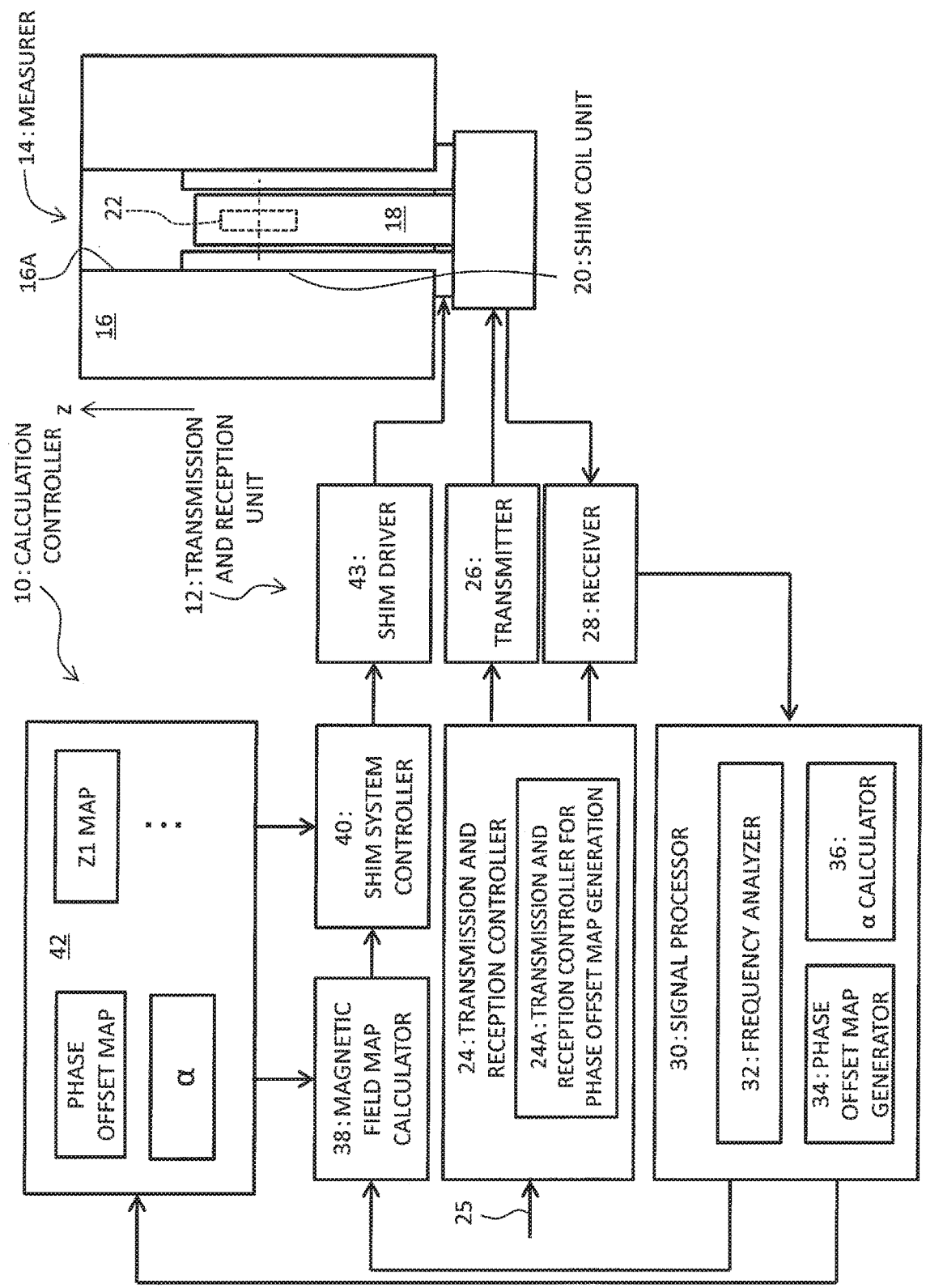
FIG. 1 is a block diagram showing an example structure of an NMR measurement apparatus according to an embodiment of the present disclosure.

FIG. 1 is a block diagram showing an example structure of an NMR measurement apparatus according to an embodiment of the present disclosure. In the following description, in order to simplify the description, one-dimensional shimming in the z direction will be described. The below-described method may alternatively be applied to two-dimensional shimming and three-dimensional shimming.

In the present embodiment, the NMR measurement apparatus comprises a calculation controller 10, a transmission and reception unit 12, and a measurer 14. A shim system is formed across these components. The shim system comprises a shim system controller 40, a shim driver 43, a shim coil unit 20, and a special structure for calculating a magnetic field map. The calculation controller 10 is formed by an information processing device or the like which functions as a calculator and a controller. The transmission and reception unit 12 is formed from an electronic circuit. The calculation controller 10 is formed from a processor such as a CPU and a program executed on the processor. That is, a plurality of functions described below are realized by software. Alternatively, all or a part of these functions may be realized by a dedicated processor, a calculation device, an electronic circuit, or the like.

The measurer 14 is a physical structure, and specifically comprises a static magnetic field generator 16 including a superconductive coil, the shim coil unit 20 placed in a bore 16A of the static magnetic field generator 16, and a probe 18. The probe 18 comprises a specimen tube 22, and a measurement target specimen (solution) is held inside the specimen tube 22. The probe 18 comprises an insertion portion inserted into the bore 16A and a base provided outside of the bore 16A. In the insertion portion, in addition to the specimen tube, an electronic circuit including a detection coil is provided. The specimen tube 22 is rotationally driven as necessary. For example, when the z direction shimming is executed, the specimen tube 22 is rotationally driven. When two calibration maps are generated as will be described below, a standard specimen is used.

The shim coil unit 20 includes a plurality of shim coils (shim coil group) for shimming. For example, in order to execute three-dimensional shimming, a few tens of shim coils are provided, including a Z1 shim coil corresponding to a Z1 term, a Z2 shim coil corresponding to a Z2 term, a Z3 shim coil corresponding to a Z3 term, etc. A gradient magnetic field may be generated using a particular shim coil in the shim coil unit 20 (in this case, the particular coil is called a "homospoil coil"). Alternatively, a coil for generating the gradient magnetic field (FG coil) may be provided in the probe 18.

In order to improve a measurement resolution, it is necessary to improve homogeneity of the static magnetic field over an entirety of a region in which the measurement target specimen exists, and a structure for achieving this is the shim system. The shimming process is executed as necessary for each probe and for each measurement target specimen.

The calculation controller 10 comprises a transmission and reception controller 24, a signal processor 30, a magnetic field map calculator 38, the shim system controller 40, a storage unit 42, and the like. The transmission and reception controller 24 controls generation of a transmission signal and processing of a reception signal according to a pulse sequence. The transmission and reception controller 24 has a function as a sequencer. A pulse sequence is generated by an information processing device (not shown), and data showing the pulse sequence are supplied to the transmission and reception controller 24 (refer to reference numeral 25). Alternatively, the transmission and reception controller 24 has the pulse sequence generation function. The transmission and reception controller 24 comprises a transmission and reception controller for phase offset map generation 24A. The transmission and reception controller for phase offset map generation 24A executes transmission and reception control in a preliminary measurement process for generating a phase offset map. Specifically, the transmission and reception controller for phase offset map generation 24A controls transmission and reception according to a first pulse sequence and a second pulse sequence exemplified in FIG. 3 later, in the preliminary measurement process.

The signal processor 30 is a module which processes the reception signal, and comprises a frequency analyzer 32, a phase offset map generator 34, and an α calculator 36. The frequency analyzer 32 generates a complex signal on a frequency axis from a complex signal on a temporal axis (reception signal), by a complex FFT calculation. In the preliminary measurement process, a phase is calculated as an argument from a real part and an imaginary part forming the complex signal after the complex FFT calculation.

The phase offset generator 34 and the α calculator 36 function in the preliminary measurement process. The phase offset map is formed from phase offsets at various positions in the z direction. Each phase offset corresponds to an initial value of the phase which does not depend on the phase evolution period τ or the inhomogeneous magnetic field component. A variable α is a ratio which is used in the generation of the phase offset map and in the calculation of the magnetic field map. The generation of the phase offset map and calculation of the ratio α will be described later in detail.

The single processor 30 functions as a phase map generator. The phase offset map generator 34 functions as a phase offset map generation unit. The magnetic field map calculator 38 to be described later functions as a magnetic field map calculator, and the shim system controller 40 functions as a shim adjuster.

The storage unit 42 is formed from a memory or the like, and stores the phase offset map and the ratio α calculated in the preliminary measurement process. In addition, the storage unit 42 stores in advance basic maps (Z1 map and the like) forming the entities of the shim terms. When the three-dimensional shimming is executed, in addition to Z1 map~Z6 map, an X1 map, an XZ1 map, an X2 map, an XZ2 map, . . . are determined in advance and stored in the storage unit 42.

The magnetic field map calculator 38 calculates a magnetic field map based on the phase map acquired by execution of the second pulse sequence having a longer phase evolution period long τ, and the phase offset map and the ratio α stored in the storage unit 42. In the present embodiment, based on a presumption that the phase offset map and the ratio α are determined in advance, it is sufficient to only execute the second pulse sequence for each magnetic field map calculation, and execution of the first pulse sequence having a shorter phase evolution period short τ is not necessary.

The shim system controller 40 controls the shimming process. Specifically, the shim system controller 40 determines an optimum combination of the plurality of shim values to be given to the plurality of basic maps forming a combined map such that a difference map after the combined map is subtracted from the magnetic field map is minimized. In this process, the plurality of basic maps stored in the storage unit 42 are referred to. Normally, while the combination of the plurality of shim values is changed, the processes of calculating and evaluating the difference map (that is, correction magnetic field adjustment) is repeated.

The transmission and reception unit 12 comprises the shim driver 43, a transmitter 26, and a receiver 28. The transmitter 26 is a circuit which generates an RF transmission pulse according to the pulse sequence, and supplies the RF transmission pulse to the probe 18, under the control of the transmission and reception controller 24. The receiver 28 is a circuit which processes an RF reception signal (FID signal) which is output from the probe 18, under the control of the transmission and reception controller 24. The reception signal after the processing is sent to the signal processor 30. Alternatively, a control signal may be supplied from the transmission and reception controller 24 to the shim system controller 40 when the gradient magnetic field is formed.

Figure 2:
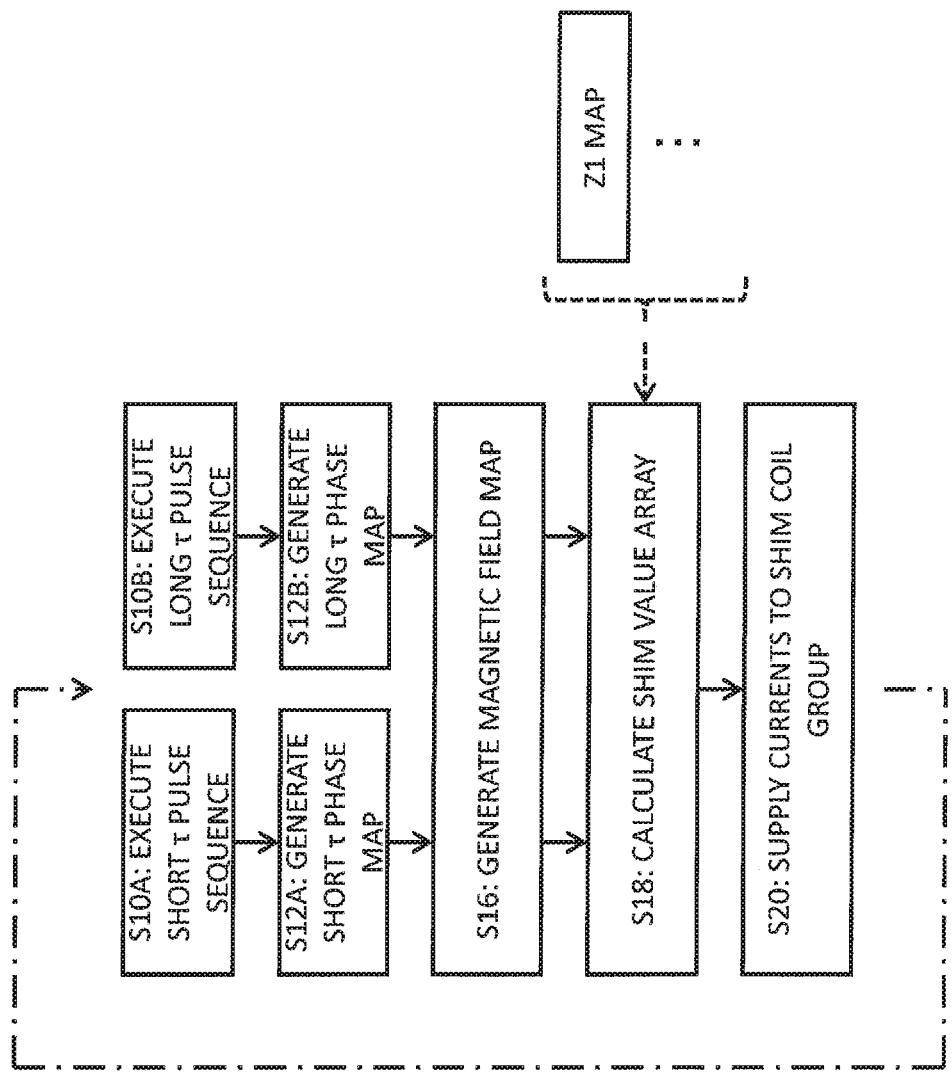
FIG. 2 is a flowchart showing a shimming method of related art.

FIG. 2 shows a shimming operation of the related art. In S10A, transmission and reception based on a short τ pulse sequence (first pulse sequence) is executed. With this process, in S12A, a short τ phase map is generated. A horizontal axis of the phase map is the z axis, and a vertical axis of the phase map is a phase axis. The short τ phase map is represented by Equation (1) described above. At a timing different from S10A, S10B is executed. In S10B, transmission and reception based on a long τ pulse sequence (second pulse sequence) are executed. With this process, in S12B, a long τ phase map is generated. The long τ phase map is represented by Equation (2) described above.

In S16, according to Equation (3) described above, the short τ phase map is subtracted from the long τ phase map, to calculate a Δτ phase map. The Δτ phase map is divided by Δτ, to calculate a magnetic field map. The magnetic field map is the ΔB0inhomo magnetic field map in Equation (3) described above. In S18, a plurality of shim values (shim value array) to be given to the plurality of basic maps forming the combined map are searched so that the result of adding the combined map to the magnetic field map thus determined is as flat as possible. In S20, based on the plurality of shim values, a plurality of current values are calculated, and a plurality of currents having these current values are supplied to the shim coil group. In this manner, a correction magnetic field is generated, or the correction magnetic field which is already in effect is changed. By repeating the above-described process while varying the correction magnetic field, the optimum combination of the plurality of shim values is searched. Alternatively, in S16, the division by Δτ with respect to the Δτ phase map may be omitted, and the Δτ phase map may be handled as a map corresponding to the ΔB0inhomno magnetic field map.

Figure 3:
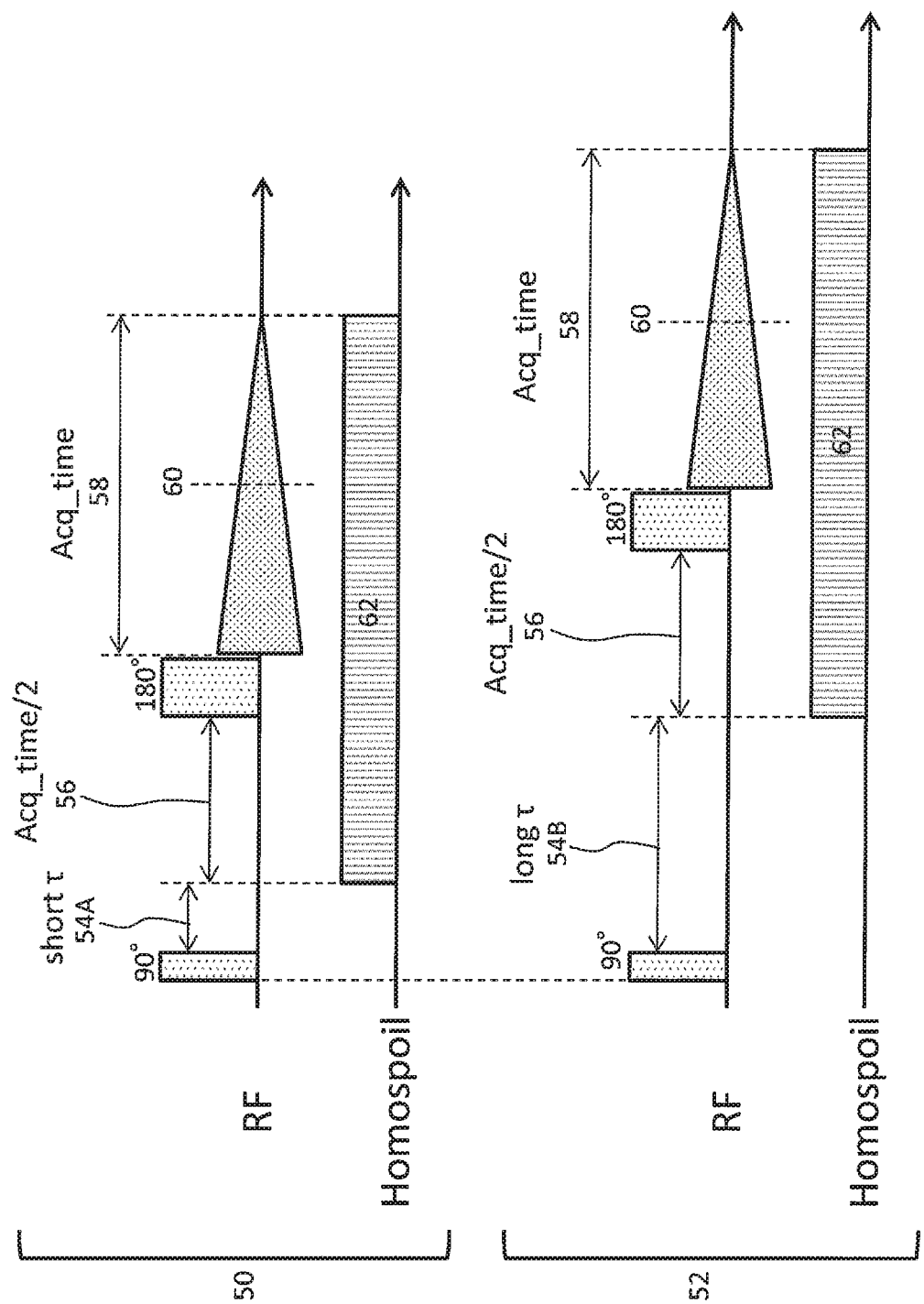
FIG. 3 is a diagram showing examples of a first pulse sequence and a second pulse sequence.

FIG. 3 shows the first pulse sequence at an upper part 50. FIG. 3 also shows the second pulse sequence at a lower part 52. At the upper part 50 and the lower part 52, two transmission pulses (a 90° pulse and a 180° pulse) and a reception period (Acq_time) 58 are shown in an upper area, and an application period 62 of the gradient magnetic field is shown in a lower area.

The first pulse sequence and the second pulse sequence will now be specifically described. First, a transverse magnetization is generated by the 90° pulse. Periods 54A and 54B following this are the phase evolution periods τ (short τ and long τ), and the phase of the transverse magnetization is widened (in other words, the deviation from the on-resonance is expanded in a rotational coordinate system) according to the size of the inhomogeneous magnetic field component at each position in the z direction during the periods 54A and 54B. A next period 56 has a half temporal length of the reception period (Acq_time/2), and during the period 56, the phase is widened by both the inhomogeneous magnetic field component and the gradient magnetic field. Then, by the 180° pulse, the phase is inverted at each position in the z direction. In a reception period 58, the phase component widened in periods other than the periods 54A and 54B converges to zero at a middle point 60 (that is, a point in time where Acq_time/2 is elapsed from 180° pulse), and spin echo is observed. That is, the phase observed at this point is only the phase widened due to the influence of the inhomogeneous magnetic field component. The phase is specified by calculating the argument using the real part and the imaginary part of the complex signal after the frequency analysis. In this case, for example, φ=a tan 2(imag, real) is calculated.

As described, the first phase map is acquired by the execution of the first pulse sequence, and the second phase map is acquired by the execution of the second pulse sequence. Then, the first phase map is subtracted from the second phase map, to cancel the phase offset map, and consequently acquire the Δτ phase map. Then, the Δτ phase map is divided by Δτ, to determine the magnetic field map. As already described above, the division by Δτ may be omitted in some cases.

In the method of the related art shown in FIG. 2, it is necessary to execute two measurements for each calculation of the magnetic field map. In contrast, according to a method of the present embodiment described below, the number of measurements can be halved.

Figure 4:
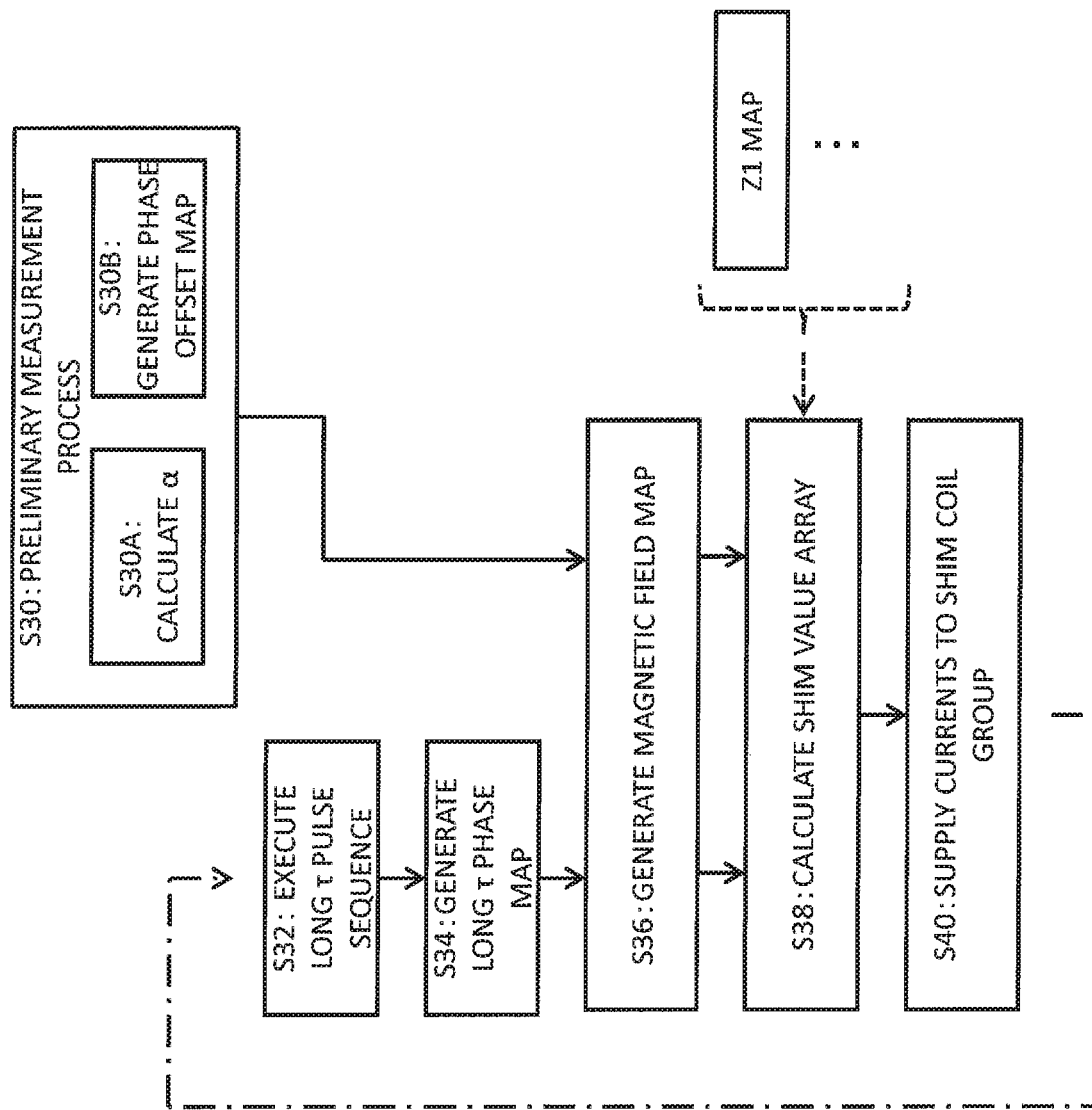
FIG. 4 is a flowchart showing a shimming method according to an embodiment of the present disclosure.

In FIG. 4, prior to the execution of a main measurement process (magnetic field map calculation process) from S32 and on, a preliminary measurement process S30 is executed. The preliminary measurement process S30 includes a process S30A of calculating a ratio α between the long τ and Δτ, and a process S30B of generating a phase offset map. The details of these processes will be described later with reference to FIG. 5.

In S32, transmission and reception according to the long τ pulse sequence (second pulse sequence) is executed, and, as a result, in S34, a long τ phase map is generated. In S36, the following calculation is executed to generate a magnetic field map.

Magnetic field map=(long τ phase map−phase offset map)/(α∆τ)  (4)

The term in a numerator of Equation (4), (long τ phase map−phase offset map) is expressed, in view of Equation (2) described above, (long τ*∆B0inhomo magnetic field map). The term α in a denominator of Equation (4) is defined as α=long τ/(long τ−short τ). The term α will be described later in detail. The term ∆τ is the phase evolution period difference as already described, and, when Equation (4) is executed, a setting value is used as ∆τ. In Equation (4), the division by ∆τ may be omitted in some cases, and in this case, a magnetic field map which is multiplied by ∆τ is determined.

In S38 and S40, processes similar to those of S18 and S20 shown in FIG. 2 are executed. In any case, according to the method of the present embodiment, performance of two measurements for each magnetic field map calculation is not necessary, and one measurement is sufficient. This results in a great advantage that the shimming time can be shortened.

Figure 5:
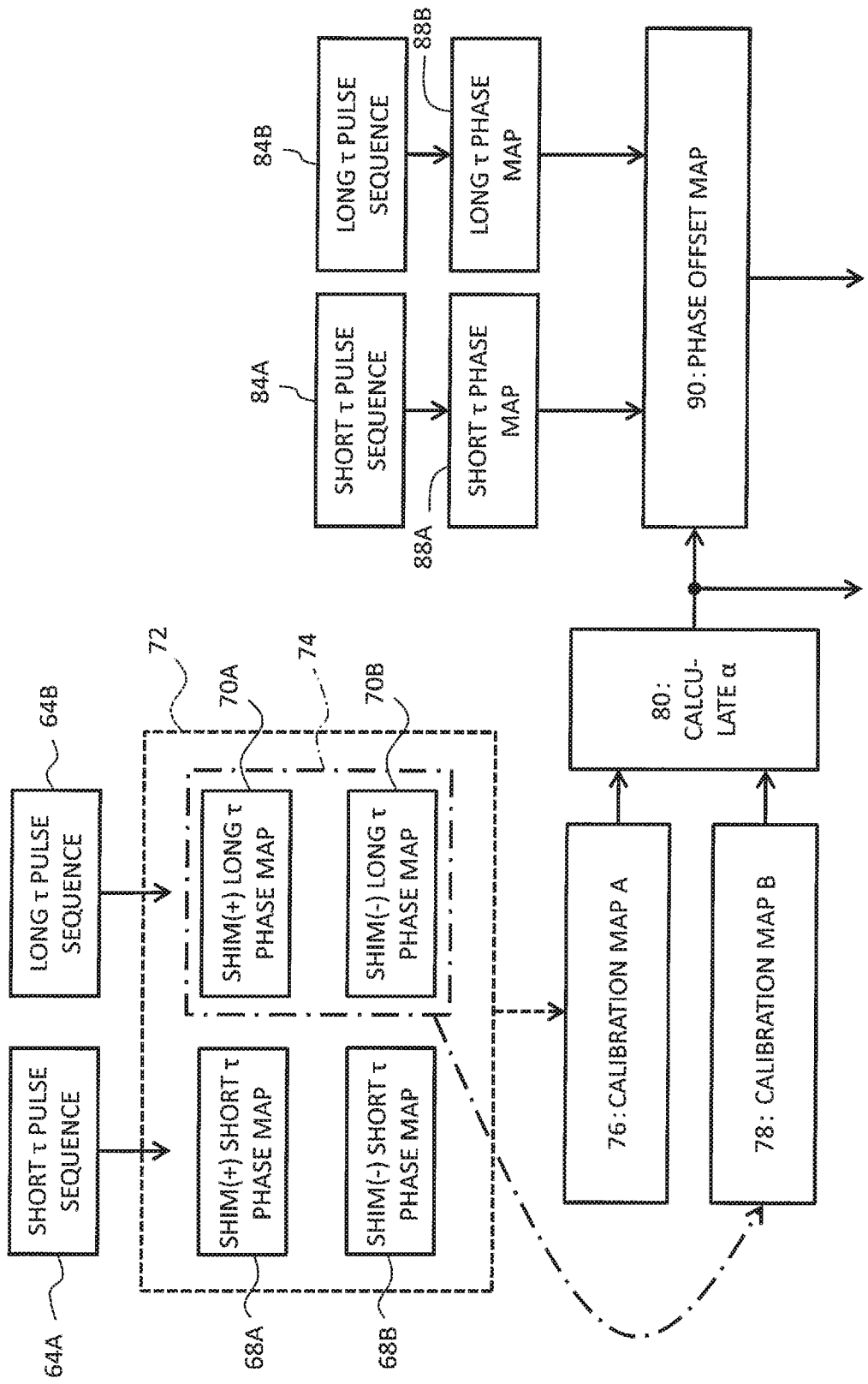
FIG. 5 is a diagram showing a first example of a preliminary measurement process shown in FIG. 4.

FIG. 5 is a conceptual diagram of a first example of the preliminary measurement process (S30 in FIG. 4). Reference numerals from 64A and 64B to 80 show the ratio calculation process, and reference numerals from 84A and 84B to 90 show the phase offset map calculation process.

First, the ratio calculation process will be described. The ratio α is defined as α=long τ/(long τ−short τ)=long τ/∆τ. As will be described below, the ratio α is calculated without being affected by the inhomogeneous magnetic field component or the phase offset.

Of the plurality of shim terms, a particular shim term (for example, Z1, Z2, Z3, or Z4) is selected. As will be described later in FIGS. 6~9, according to experiments, an approximately identical offset map can be acquired by selecting any of the shim terms.

After a shim value (current value) of the particular shim term is changed to a positive side by a predetermined value, a short τ pulse sequence 64A and a long τ pulse sequence 64B are executed, to acquire a shim(+) short τ phase map (positive side first phase map) 68A and a shim(+) long τ phase map (positive side second phase map) 70A. Further, the shim value (current value) of the particular shim term is changed in the negative side by a predetermined value, and the short τ pulse sequence 64A and the long τ pulse sequence 64B are executed, to acquire a shim(−) short τ phase map (negative side first phase map) 68B and a shim(−) long τ phase map (negative side second phase map) 70B. The four phase maps are represented as follows.

Shim(+) short τ phase map

=phase offset map+short τ*∆B0inhomo magnetic field map+short τ*shim(+) magnetic field map  (5-1)

Shim(+) long τ phase map

=phase offset map+long τ*∆B0inhomo magnetic field map+long τ*shim(+) magnetic field map  (5-2)

Shim(−) short τ phase map

=phase offset map+short τ*∆B0inhomo magnetic field map+short τ*shim(−) magnetic field map  (5-3)

Shim(−) long τ phase map

=phase offset map+long τ*∆B0inhomo magnetic field map+long τ*shim(−) magnetic field map  (5-4)

In the above description, the ∆B0inhomo magnetic field map is a distribution of the inhomogeneous magnetic field component generated from before the measurement. The shim(+) magnetic field map is a map showing a change of the magnetic field at each position in the z direction when the particular shim value is changed in the positive side, and the shim(−) magnetic field map is a map showing a change of the magnetic field at each position in the z direction when the particular shim value is changed in the negative side. In FIG. 5, the four phase maps are specified by reference numeral 72. The shim(+) long τ phase map 70A and the shim(−) long τ phase map 70B are specified by reference numeral 74.

With the above as a presumption, a calibration map A (refer to reference numeral 76) is calculated as follows according to a method of determining a basic map (calibration map) of the shim.

Calibration map A

=(shim(+) long τ phase map−shim(+) short τ phase map)−(shim(−) long τ phase map−shim(−) short τ phase map)  (6-1)

=(long τ−short τ)*(shim(+) magnetic field map−shim(−) magnetic field map)

=∆τ*∆shim calibration map  (6-2)

The calibration map A is a map showing an amount of change of the phase with respect to an amount of change of the shim created during the period of ∆τ at each position in the z direction. In the determination process of the calibration map A, the distribution of the inhomogeneous magnetic field component (magnetic field map) and the phase offset map are cancelled out. Therefore, the calibration map A may be referred to as a reference ∆τ phase map. In Equation (6-2), ∆τ is one of two parameters required for calculating α, and the ∆shim calibration map corresponds to the basic map of the shim (calibration map showing the distribution of the correction magnetic field component). Alternatively, in place of the ∆shim calibration map, ∆τ *∆shim calibration map may be used as the basic map of the shim. When both the magnetic field map and the basic maps are multiplied by ∆τ, there is no problem when comparing the magnetic field map and the combined map.

On the other hand, a calibration map B (refer to reference numeral 78) is calculated as follows.

Calibration map B

=shim(+) long τ phase map−shim(−) long τ phase map  (7-1)

=long τ*(shim(+) magnetic field map−shim(−) magnetic field map)

=long τ*∆shim calibration map  (7-2)

The calibration map B is a map showing an amount of change of the magnetic field with respect to an amount of change of the shim created in the period of long τ at each position in the z direction. In the determination process of the calibration map B, the distribution of the inhomogeneous magnetic field component (magnetic field map) and the phase offset map are cancelled out. Therefore, the calibration map B may be referred to as a reference long τ phase map. In Equation (7-2), long τ is the other of the two parameters necessary for calculating α, and the Δshim calibration map is a component included also in the calibration map A.

The ratio α is specified by determining a combination of α and β which minimizes $\Sigma\varepsilon^2$, assuming the following Equation (8).

ε=−α(calibration map $A$)+(calibration map $B$)+β (8)

For determining the combination of α and β which minimizes $\Sigma\varepsilon^2$, a method of least squares may be employed. More specifically, singular value decomposition and the Newton method or the like may be employed. In comparison of Equation (6-2) and Equation (7-2) described above, it can be seen that Δshim calibration map is common to these equations, and the difference lies in Δτ and long τ. In Equation (8), the point where $\Sigma\varepsilon^2$ is minimized is a point where two calibration maps are most fitted with each other by the action of the ratio α. The ratio α at this point can be assumed to be a ratio showing a true relationship between Δτ and long τ (α=long τ/Δτ).

When the long τ phase map −α(long τ phase map−short τ phase map) is calculated, the following is derived from Equations (1) and (2) and the above-described definition of the ratio α.

Long τ phase map−α(long τ phase map−short τ phase map)

=phase offset map+long τ*ΔB0inhomo magnetic field map−long τ/(long τ−short τ)(phase offset map+long τ*ΔB0inhomo magnetic field map−phase offset map−short τ*ΔB0inhomo magnetic field map)

=phase offset map

Arranging the above, the phase offset map is calculated as follows.

Phase offset map

=long τ phase map−α(long τ phase map−short τ phase map) (9)

Therefore, once the short τ pulse sequence 84A and the long τ pulse sequence 84B are sequentially executed to acquire the short τ phase map 88A and the long τ phase map 88B in FIG. 5, based on these phase maps and the ratio α which is already determined, the phase offset map 90 can be determined based on Equation (9) described above.

The phase offset map and the ratio α calculated in the preliminary measurement process are stored in the storage unit. Then, in a process of determining a magnetic field map, the magnetic field map is calculated according to Equation 4 and based on the phase map acquired by the execution of the second pulse sequence, and the stored offset map and ratio α. The shim adjustment is then executed according to the magnetic field map.

In the above-described first example of the preliminary measurement process, even if the actual short τ and the actual long τ (or the actual long τ and the actual Δτ) are not known, the ratio α can be accurately estimated, and, consequently, the phase offset map can be accurately calculated.

Figure 6:
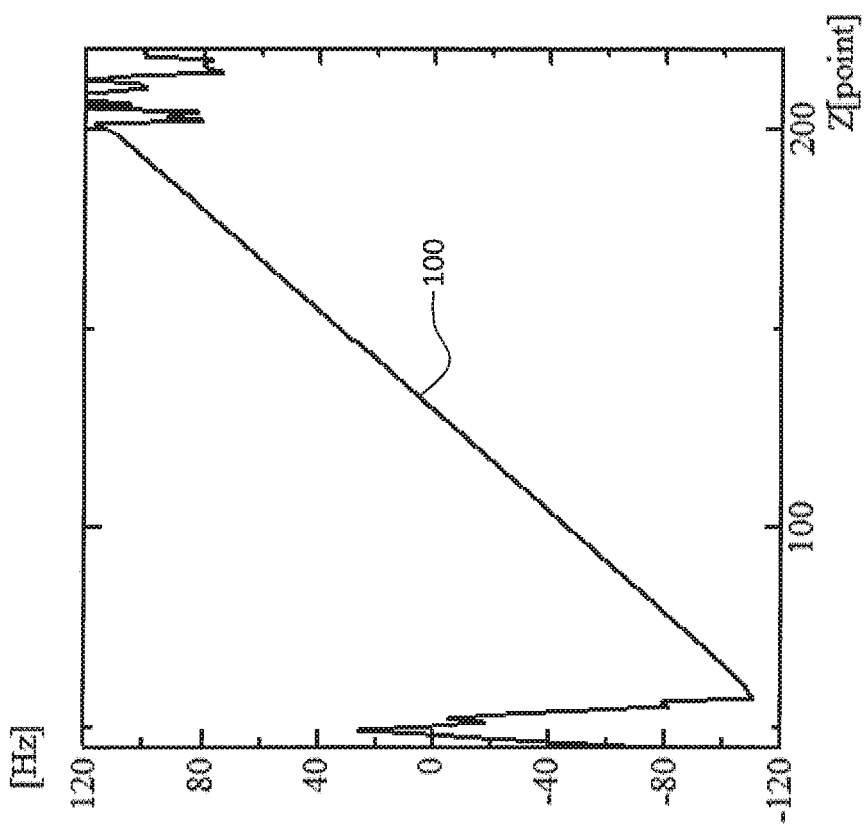
FIG. 6 is a diagram showing a phase offset map which is estimated using a Z1 term in the first example.
Figure 7:
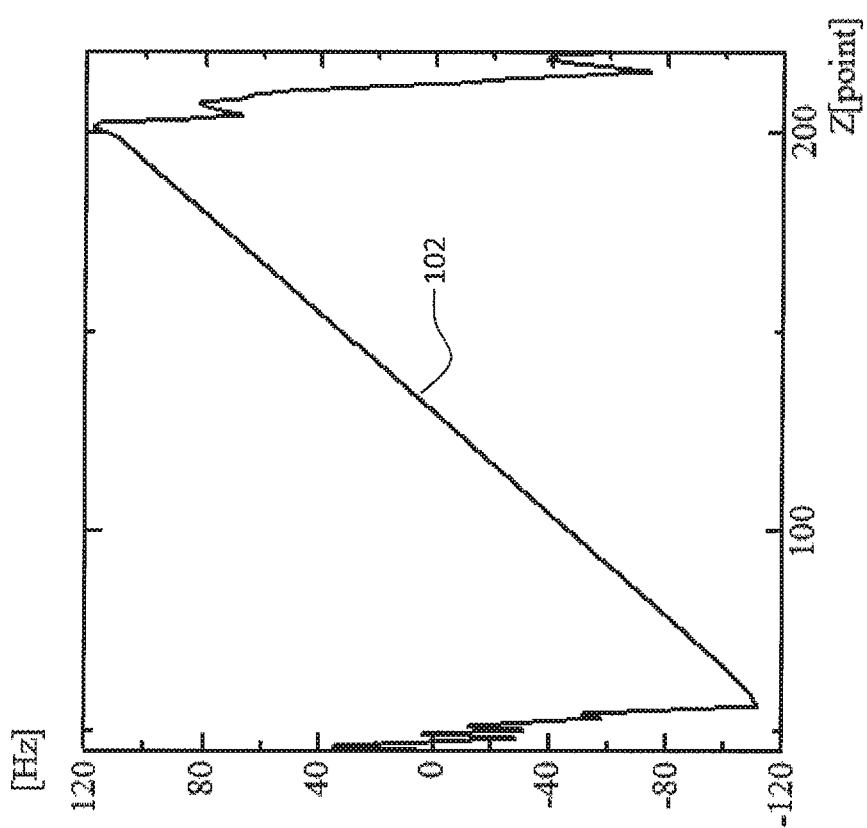
FIG. 7 is a diagram showing a phase offset map which is estimated using a Z2 term in the first example.
Figure 8:
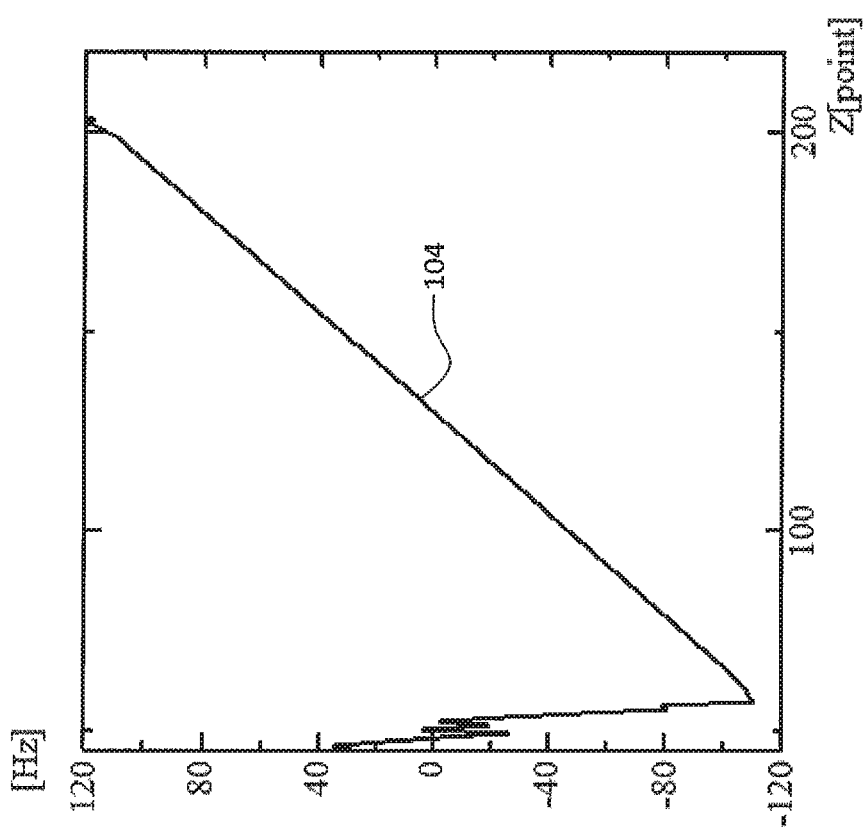
FIG. 8 is a diagram showing a phase offset map which is estimated using a Z3 term in the first example.
Figure 9:
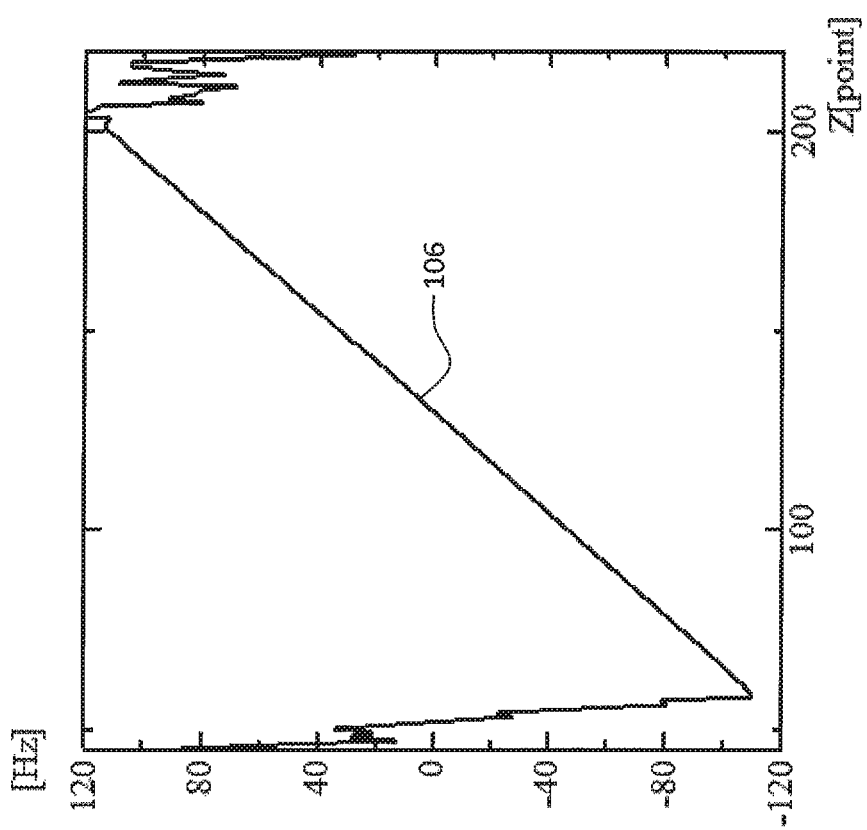
FIG. 9 is a diagram showing a phase offset map which is estimated using a Z4 term in the first example.

FIG. 6 shows a phase offset map 100 calculated when the shim Z1 is selected in generation of the calibration maps A and B. A horizontal axis shows a position in the z direction, and a vertical axis shows a phase (angular frequency ω). This is similarly applicable to FIGS. 7~9 to be described below. FIG. 7 shows a phase offset map 102 calculated when the shim Z2 is selected in generation of the calibration maps A and B, FIG. 8 shows a phase offset map 104 calculated when the shim Z3 is selected in generation of the calibration maps A and B, and FIG. 9 shows a phase offset map 106 calculated when the shim Z4 is selected in generation of the calibration maps A and B. As can be understood from comparison of FIGS. 6~9 to each other, an approximate same phase offset map can be acquired when any shim (shim term) is selected. In acquiring the measurement results of FIGS. 6~9, a measurement target nucleus is 2 H, and a static magnetic field of 600 MHz (14.1 T) is used in 1 H frequency.

Figure 10:
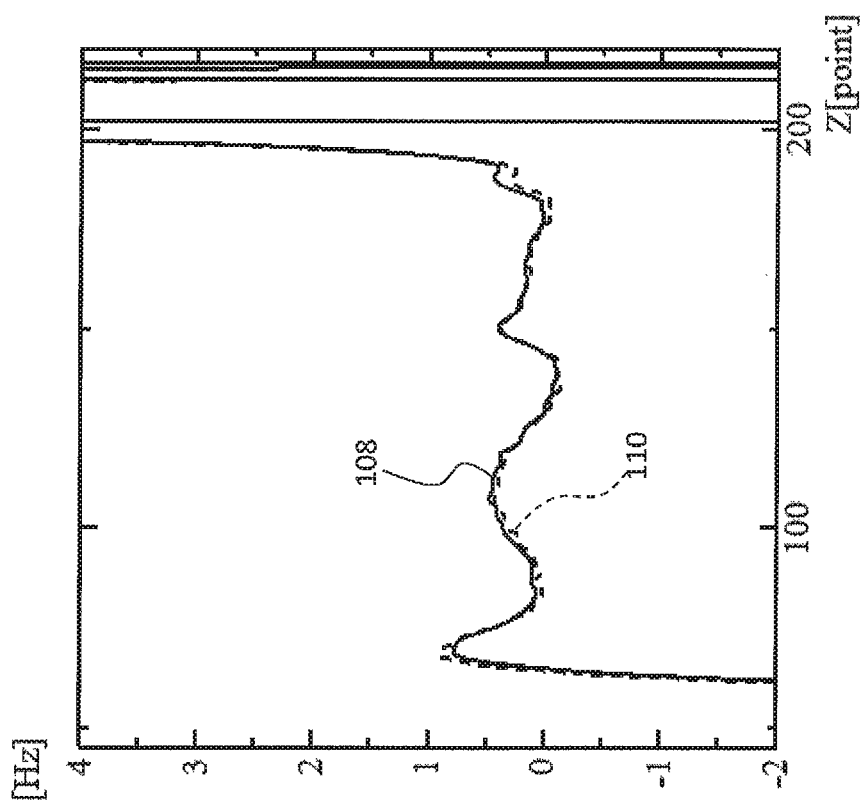
FIG. 10 is a diagram showing a magnetic field map calculated by a method of related art and a magnetic field map calculated by a method according to an embodiment of the present disclosure.

FIG. 10 shows a magnetic field map (solid line) 108 acquired by the method of the related art shown in FIG. 2, and a magnetic field map (broken line) 110 acquired by the method of the present embodiment shown in FIG. 4 or the like. The measurement conditions are similar to the above. A horizontal axis shows a position in the z direction, and a vertical axis shows an intensity of the inhomogeneous magnetic field component. The ends in the horizontal axis are regions which are not actually used, and a region between the ends is the region which is actually used. In this region, the magnetic field map 110 is very close to the magnetic field map 108. Based on this, it can be understood that replacement of the method of the related art with the method of the present embodiment is sufficiently tolerable.

Figure 11:
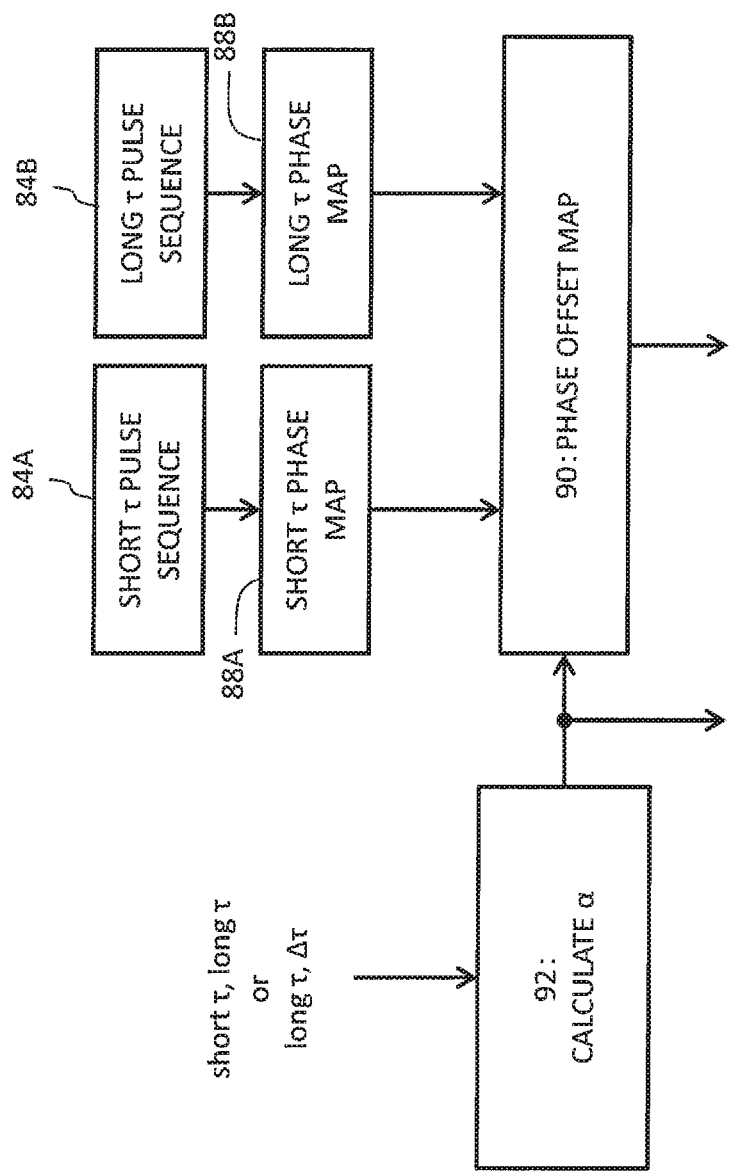
FIG. 11 is a diagram showing a second example of the preliminary measurement process shown in FIG. 4.

FIG. 11 shows a second example of the preliminary measurement process. When short τ and long τ (or long τ and Δτ) are known (for example, when there is no problem in using the setting values without any processing), the second example as shown in FIG. 11 can be employed. Here, reference numerals 84A to 90 represent the same structures as in the first example shown in FIG. 5. In the second example, in an α calculation 92, the ratio α is calculated from the short τ and the long τ (or the long τ and the Δτ) which are set or actually measured. The ratio α is used in the calculation of the phase offset map 90, and also in the calculation of the magnetic field map.

In the above description, the method of the present embodiment has been described assuming one-dimensional gradient shimming. Alternatively, the method of the present embodiment may be applied to two-dimensional gradient shimming or three-dimensional gradient shimming. In this case, the phase offset map is a three-dimensional map formed from a phase offset for each three-dimensional coordinate (x, y, z).

In the embodiment described above, in the measurement of the magnetic field, the long τ phase map is acquired. Alternatively, the short τ phase map may be acquired. In the embodiment described above, the pulse echo method is applied. Alternatively, the gradient echo method or other methods may be applied.

The invention claimed is:

1. A nuclear magnetic resonance measurement apparatus comprising:
   a phase offset map calculator functioning in a preliminary measurement process to determine a phase offset map based on a first phase map acquired by preliminary execution of a first pulse sequence having a first phase evolution period and a second phase map acquired by preliminary execution of a second pulse sequence having a second phase evolution period, wherein the phase offset map is inevitably caused due to nuclear magnetic resonance signal processing in the nuclear magnetic resonance measurement apparatus and is an initial value map;
   a magnetic field map calculator functioning in a magnetic field map generating process to calculate, for each magnetic field map calculation, a magnetic field map, which shows a spatial distribution of an inhomogeneous magnetic field component, based on a phase map acquired by a subsequent execution of the second pulse sequence while forgoing acquisition of a subsequent execution of the first pulse sequence and the phase offset map; and an adjuster that executes shim adjustment based on the magnetic field map.

2. The nuclear magnetic resonance measurement apparatus according to claim 1, wherein the second phase evolution period is longer than the first phase evolution period.

3. The nuclear magnetic resonance measurement apparatus according to claim 2, wherein the magnetic field map calculator calculates the magnetic field map by subtracting the phase offset map from the phase map.

4. The nuclear magnetic resonance measurement apparatus according to claim 2, wherein the phase offset map calculator calculates the phase offset map by calculating (the second phase map−α(the second phase map−the first phase map)), wherein α is a ratio.

5. The nuclear magnetic resonance measurement apparatus according to claim 4, wherein the phase offset map calculator comprises:

an acquirer that acquires a positive-side first phase map and a positive-side second phase map by preliminarily executing the first pulse sequence and the second pulse sequence in a state where a value of a particular shim coefficient is changed in a positive side, and that acquires a negative-side first phase map and a negative-side second phase map by preliminarily executing the first pulse sequence and the second pulse sequence in a state where the value of the particular shim coefficient is changed in a negative side; and a ratio calculator that calculates the ratio α based on the positive-side first phase map, the positive-side second phase map, the negative-side first phase map, and the negative-side second phase map.

6. The nuclear magnetic resonance measurement apparatus according to claim 5, wherein the ratio calculator comprises:

a generator that generates a first calibration map by subtracting, from a first subtraction map generated by subtracting the positive-side first phase map from the positive-side second phase map, a second subtraction map generated by subtracting the negative-side first phase map from the negative-side second phase map;

a generator that generates a second calibration map by subtracting the negative-side second phase map from the positive-side second phase map; and a calculator that calculates the ratio α based on the first calibration map and the second calibration map.

7. The nuclear magnetic resonance measurement apparatus according to claim 4, further comprising:

a ratio calculator that calculates the ratio α based on the first phase evolution period and the second phase evolution period.

8. The nuclear magnetic resonance measurement apparatus according to claim 1, wherein the adjuster that executes the shim adjustment is a unit that executes one-dimensional shimming, two-dimensional shimming, or three-dimensional shimming.

9. A method of calculating a magnetic field map, comprising:

functioning in a preliminary measurement process to determine a phase offset map based on a first phase map acquired by preliminary execution of a first pulse sequence having a first phase evolution period and a second phase map acquired by preliminary execution of a second pulse sequence having a second phase evolution period which is longer than the first phase evolution period, wherein the phase offset map is inevitably caused due to nuclear magnetic resonance signal processing in the nuclear magnetic resonance measurement apparatus and is an initial value map; and for each magnetic field map calculation, functioning in a magnetic field map generating process to calculate a magnetic field map which shows a spatial distribution of an inhomogeneous magnetic field component, based on a phase map acquired by a subsequent execution of the second pulse sequence while forgoing acquisition of a subsequent execution of the first pulse sequence and the phase offset map.

* * * * *